United States Patent

[11] 3,617,767

[72] Inventor Robert Kenneth Booher
Mission Viejo, Calif.
[21] Appl. No. 10,966
[22] Filed Feb. 11, 1970
[45] Patented Nov. 2, 1971
[73] Assignee North American Rockwell Corporation
Continuation of application Ser. No. 523,767, Jan. 28, 1966, now Patent No. 3,526,783, dated Sept. 1, 1970.

[54] FIELD EFFECT TRANSISTOR LOGIC GATE WITH ISOLATION DEVICE FOR REDUCING POWER DISSIPATION

8 Claims, 4 Drawing Figs.

[52] U.S. Cl. .......... 307/205, 307/208, 307/213, 307/221 C, 307/251
[51] Int. Cl. .......... H03k 19/08, G11c 19/00
[50] Field of Search .......... 307/205, 221 C, 251, 279, 304, 208

[56] References Cited
UNITED STATES PATENTS

| | | | |
|---|---|---|---|
| 3,461,312 | 8/1969 | Farber et al. | 307/221 |
| 3,526,783 | 9/1970 | Booher | 307/279 X |
| 3,497,715 | 2/1970 | Yen | 307/304 X |

OTHER REFERENCES

Application Notes From General Instruments Corp., Dec. 1967, " Mtos Shift Registers" By Sidorsky (Copy enclosed)

*Primary Examiner*—John S. Heyman
*Attorneys*—L. Lee Humphries, H. Fredrick Hamann and Robert G. Rogers

ABSTRACT: The logic gate includes a two-terminal logic network comprising one or more field effect transistors. Signals on the gate electrodes of the field effect transistors determine the impedance of an electrical path between the terminals. During a first phase recurring clock signal, a first semiconductor switch is turned on to connect a first voltage level to the output and to a first terminal of the logic network. During the first phase recurring clock signal, the second terminal of the logic network is isolated from a second voltage level by an isolation field effect transistor connected between the second terminal and the second voltage level. During a second phase recurring clock signal, the isolation field effect transistor is turned on to permit the output to be connected to the second voltage level through the logical network if a relatively low-impedance path exists during the second phase recurring clock signal.

INVENTOR.
ROBERT K. BOOHER
BY
Robert G. Rogers
ATTORNEY

INVENTOR.
ROBERT K. BOOHER
BY Robert G. Rogers
ATTORNEY

FIELD EFFECT TRANSISTOR LOGIC GATE WITH ISOLATION DEVICE FOR REDUCING POWER DISSIPATION

CROSS REFERENCE TO RELATED PATENT

The present application is a continuation of application Ser. No. 523,767, filed Jan. 28, 1966, now U.S. Pat. No. 3,526,783, issued Sept. 1, 1970 to Robert K. Booher.

BACKGROUND OF THE INVENTION

1. Field of the Invention

The invention relates to a field-effect-transistor logic gate usable in multiple phase logic gating systems and more particularly to such a logic gate in which an isolation device is used to reduce power dissipation.

2. Description of Prior Art

Field effect transistors are used in a plurality of circuits for providing a plurality of functions. One function of a field-effect-transistor circuit is that of a logic gate used individually or as part of a multiple phase logic gating system. A shift register is one example of a multiple phase gating system. An inverter is an example of a logic gate used individually.

Certain patents have issued which describe and show field effect transistor circuits used to implement logic functions. For example, U.S. Pat. No. 3,461,312, to A. S. Farber et al. for Signal Storage Circuit Utilizing Charge Storage Characteristics of Field-Effect Transistor, teaches one field effect transistor, $T_3$, that is turned on during a first phase recurring clock signal to connect the output (including the inherent capacitance of the output) to a voltage level. At the same time, an isolation field effect transistor $T_2$ is turned off so that the logic network, illustrated as a field effect transistor $T_1$, is isolated from the output. As a result of the isolation, the inherent capacitance of the logic network is not charged during the first phase recurring clock signal.

During the second phase recurring clock signal, $T_2$ is turned on and the output is connected to the top terminal of the logic network. If the data input is false during the second phase recurring clock signal, it is possible for the charge on the output capacitance to be used to charge the inherent capacitance of the logic network. If there is a division of the charge on the output capacitance, it is possible for the voltage level at the output to be reduced below that indicating its intended logic level, i.e. a logic one, or a logic zero.

If $T_2$ had been rendered conductive, as is the case for the cross-referenced application, the inherent capacitance of a logic network would have been charged. However, if the input to the logic network had been true, an electrical path would have existed between the voltage level and ground and the power dissipation would have been increased.

U.S. Pat. No. 3,393,325 to D. R. Borror et al. for a High Speed Inverter, July 16, 1968, does not use a field effect transistor between the logic network and the output for isolation purposes during a first phase recurring clock signal. Borror uses a field effect transistor for isolating the input to the logic network during a first phase recurring clock signal ($\Phi_2$) so that the logic network is held in a false (nonconducting) state during the first phase recurring clock signal. As a result, the power dissipation described above is avoided.

U.S. Pat. No. 3,395,292 to H. C. Bogert for a Shift Register Using Insulated Gate Field Effect Transistors, July 30, 1968, shows a logic network that is turned on during a first phase recurring clock signal (as a function of the input signal) such that an electrical path does exist from a voltage level to electrical ground. An isolation transistor is turned off after the first phase recurring clock signal for isolating the output from the logic network.

Other patents showing field-effect-transistor circuits as well as other gating circuits are listed in the prosecution record of the cross-referenced application. It is not believed particularly useful to describe the patents in substantial detail.

A field-effect-transistor circuit is required which solves the problem of charge division as described above in connection with the Farber patent, without increasing the power dissipated by the circuit. The cross-referenced application includes claims directed towards the solution of the problem.

SUMMARY OF THE INVENTION

Briefly, the logic gate comprises a first semiconductor switching device which is turned on during a first phase recurring clock signal for connecting the output and one terminal of a logical network to a voltage level. The capacitance at the output as well as at the capacitance at one terminal of the logical network is charged by the application of the voltage level.

A second semiconductor switching device is connected between the other terminal of the logical network and a different voltage level for preventing an electrical path between the voltage levels. As a result, the power dissipation which might otherwise occur if an electrical path did exist is substantially reduced.

During a second phase recurring clock signal, the second semiconductor switching device is turned on for enabling the output to be connected through the logical network to the second voltage level if an electrical path exists through the logic network. Ordinarily, the logical network comprises one or more field effect transistors having gate electrodes. The signals on the gate electrodes determine the existence of the electrical path between the two terminals of a logical network. For example, if the signals are true during the second phase recurring clock signal, the output which was initially set to the first voltage level is changed to the second voltage level. The change in voltage levels at the output indicates the logic condition (true or false) of the logical network.

Since the first voltage level is applied to the one terminal of a logical network and to the output at a time when the lower terminal is isolated from a second voltage level, the problem of charge splitting and the problem of increased power dissipation which could have occurred during the first phase recurring clock signal are avoided.

Therefore, it is an object of this invention to provide an improved logic gate using an isolation semiconductor switch for reducing charge splitting without increasing the power dissipated by the logic gate.

A still further object of this invention is to provide an improved logic gate usable with multiple phase logic gating systems which has an isolation switch for preventing excessive power dissipation during the phase recurring clock signal that a voltage level is being applied to the output and to one terminal of the logical network. X A further object of this invention is to provide a logic gate implemented with field effect transistors and having a logical network which is connected between an output and one voltage level during one phase recurring clock signal to indicate the logic condition of the network but which is not connected between the output and the voltage level during a preceding phase recurring clock signal for reducing the power dissipated by the logic gate.

A further object of this invention is to provide a logic gate implemented with field effect transistors and having a logic network comprising one or more field effect transistors, in which the inherent capacitance at one terminal of the logical network is charged at the same time that the output is set to a voltage level and in which the other terminal of the logical network is isolated for preventing excessive power dissipation.

A still further object of this invention is to provide a multiple phase logic gating system using field effect transistors and having a logical network which has one terminal connected directly to an output and its other terminal which can be isolated from a different voltage level during certain intervals of the system operation. These and other objects of the invention will become apparent when taken in connection with the description of the drawings, a brief description of which follows:

DESCRIPTION OF PREFERRED EMBODIMENTS

Figure 1:
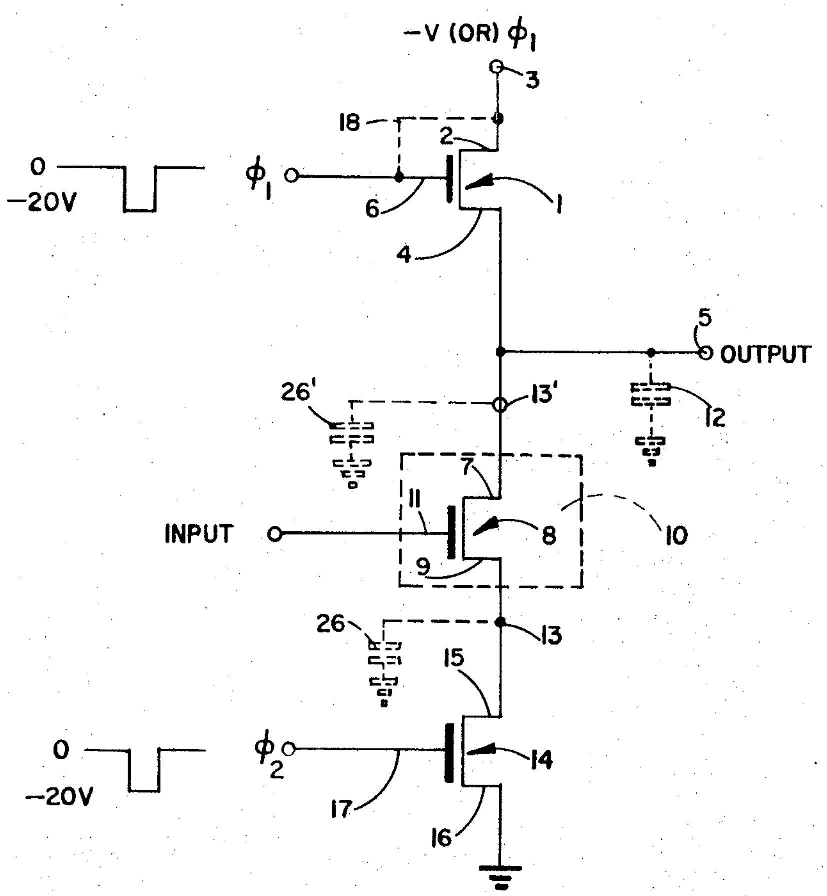
FIG. 1 is an illustration of a logic gate implemented with field effect transistors and having an isolation field effect transistor connected between one terminal of a logic network and electrical ground.

FIG. 1 is an illustration of a logic gate comprising first field effect transistor 1 having its drain electrode 2 connected to voltage source 3 and its source electrode 4 connected to output 5. Gate electrode 6 is connected to first phase recurring clock signal$\Phi_1$. For the particular embodiment shown, the voltage source is indicated to be −20 volts and the clock signal is indicated to be a pulse having a zero voltage level and a −20 voltage level. The −20 volt level is assumed to be a true logic level (logic one) and the zero volt level is assumed to be a false logic level (logic zero).

Capacitance 12 represents stray capacitance at the output between the output and ground. Ordinarily the substrate is connected to ground. In certain instances it may be necessary to add a discrete capacitance, if the stray capacitance is insufficient.

The logic gate also includes logical network 10 shown as comprising single field effect transistor 8 having its drain electrode connected to one terminal 13′ of the logic network and its source electrode 9 connected to the other terminal 13 of the logic network. The gate electrode 11 is connected to the First Input. The upper terminal 13′ is also connected directly to the output and to source electrode 4 of field effect transistor 1.

Source electrode 9 of field effect transistor 8 is connected to the lower terminal 13 and to drain electrode 15 of field effect transistor 14. Source electrode 16 of the field effect transistor 14 is connected to electrical ground. Gate electrode 17 is connected to a second phase recurring clock signal $\Phi_2$ having a zero voltage level and a −20 voltage level similar to $\Phi_1$.

It should be understood that the logic network may comprise one or more field effect transistors in various parallel or series combinations for implementing particular logic functions. For example, an AND function may be implemented by a plurality of field effect transistors connected in series. An OR logic function can be implemented by field effect transistors connected in parallel. Other functions can also be implemented as is well known to persons skilled in the art. A single transistor is shown for purposes of illustrating one embodiment of the invention.

Figure 4:
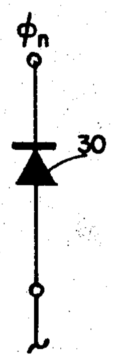
FIG. 4 is an illustration of a diode that can be used in some instances as a substitute for a field effect transistor.

As shown by the dotted line 18, the gate electrode 6 and the voltage source 3 may be connected together and both connected to clock signal $\Phi_1$. In that case, the use of a separate voltage source can be avoided. In addition, as shown in FIG. 4, a diode 30 may be used in some instances as a substitute for field effect transistors 1 and 14. It is pointed out, however, that the leakage through a diode is generally greater than the leakage of a field effect transistor and that additional process steps are required to implement a diode. A diode may also require additional area of a chip (substrate). Therefore, although a diode can be used, a field effect transistor is preferred. It should be noted that although P-type field effect transistors are required to implement the FIG. 1 embodiment as well as the other embodiments described herein, N-type field effect transistors could also be used by changing the polarities of the signals and voltages involved. In addition, although the voltage level at terminal 3 is shown to be −20 volts for unconditionally charging the capacitance 12 at the output 5 during the first phase recurring clock signal $\Phi_1$, and that source electrode 16 is shown connected to electrical ground, the polarities could be reversed. In other words, terminal 3 could be connected to electrical ground for unconditionally setting the output to electrical ground voltage level during $\Phi_1$ and source electrode 16 could be connected to −20 volts for changing the output capacitance to −20 volts during $\Phi_2$ if an electrical path exists between terminals 13 and 13′ of the logical network 10.

In operation, transistor 1 is turned on during the true interval (−20V) of the $\Phi_1$ first phase recurring clock signal for applying −20 volts to output 5 and to terminal 13′ of logical network 10. Capacitance 12 is therefore charged to −20 volts and the inherent capacitance 26′ of the logical network is also charged to −20 volts. Capacitance 26′ represents the inherent capacitance of the logical network which may include the drain to substrate capacitance, and the capacitance of the electrical conductors. Capacitance 26 illustrates the inherent capacitance at terminal 13 of the logical network.

During $\Phi_1$ time, transistor 14 is turned off so that terminal 13 of the logical network is isolated from electrical ground. Therefore, even if the input signal on gate electrode 11 is a true during the first phase recurring clock signal, there is no electrical path between −20 volts and electrical ground. Since the electrical path is interrupted by the transistor 14, no current can flow through the logical network for dissipating power during $\Phi_1$.

By applying the −20 volts to the terminal 13′ of the logical network and the output during $\Phi_1$, the inherent capacitance 26′ is charged at the same time that the output capacitance is charged. As a result, during $\Phi_2$, i.e. when the $\Phi_2$ clock is −20 volts for turning transistor 14 on, even if the input signal on gate electrode 11 is false, the charge on capacitor 12 is not shared with the inherent capacitance 26′ connected at terminal 13′. If the inherent capacitance at terminal 13′ had not been charged during $\Phi_1$ time, it would have been possible for the charge on capacitance 12 to have been drained off to charge capacitance 26′. If that had occurred, the voltage level at the output could have been reduced so that instead of indicating a logic one, sit would have been interpreted as a logic zero. By interpreting the output as a logic zero, the input would have been assumed to be true even though for the example it was assumed to be false.

During the second phase recurring clock signal, i.e. when $\Phi_2$ is true, (−20 volts), transistor 14 is turned on. If the input on gate electrode 11 is true, a relatively low impedance path exists between terminals 13′ and 13 of logic network 10. Since transistor 14 is turned on, terminal 13 is connected to electrical ground. As a result, the voltage at the output, i.e. −20 volts, is changed to electrical ground as capacitance 12 discharges through the logical network to electrical ground.

Since the output changed in response to an input signal, the logical network is indicated to have been true during the $\Phi_2$ clock interval. In other words, although the output is unconditionally set true during $\Phi_1$, it is conditionally set false as a function of the logic state of the input signal during $\Phi_2$.

Figure 2:
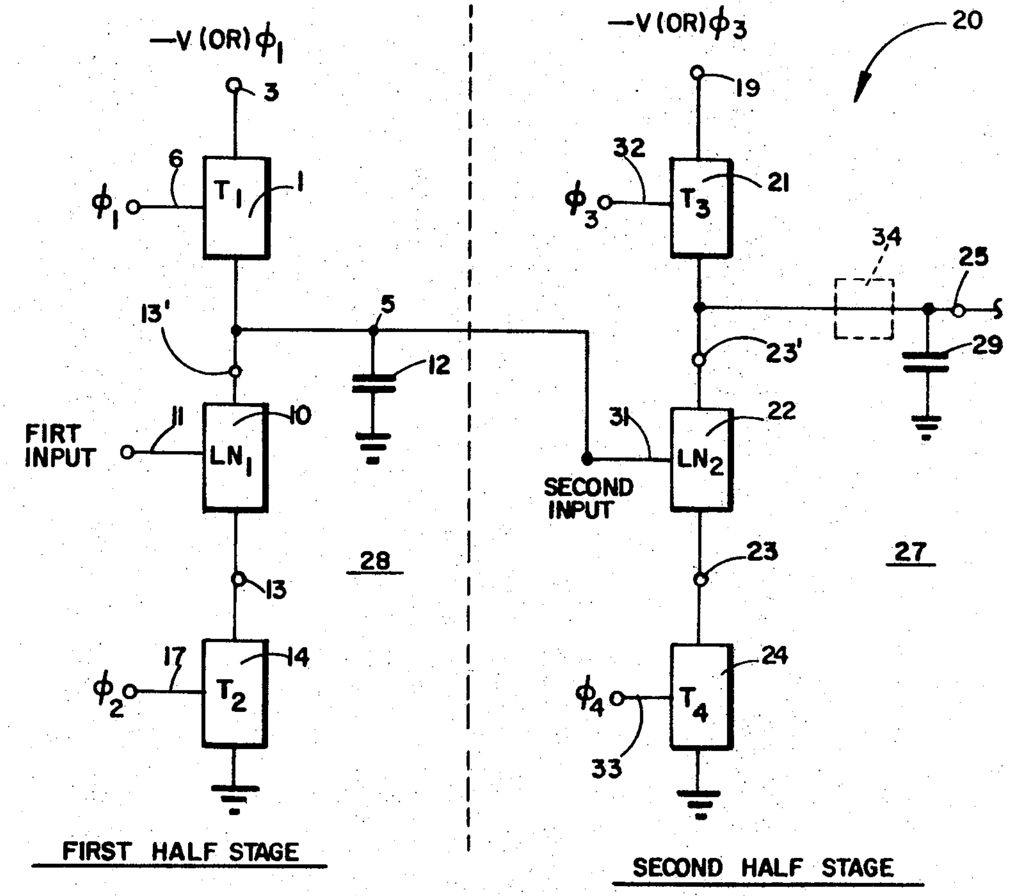
FIG. 2 is an illustration of a multiple phase logic gate using two FIG. 1 logic gates clocked with FIG. 2 phase recurring clock signals for implementing one stage of a shift register.

FIG. 2 is an illustration of shift register 20 comprising a first half stage 28 and a second half stage 27. The field effect transistors 6, 14, 21 and 24 are illustrated as blocks and labeled $T_1$–$T_4$ and the logic networks 10 and 22 are illustrated as blocks labeled $LN_1$ and $LN_2$. It should be assumed that each field effect transistor has a gate, source and drain electrode connected in a manner shown in FIG. 1 or as described for alternate embodiments.

Figure 3:
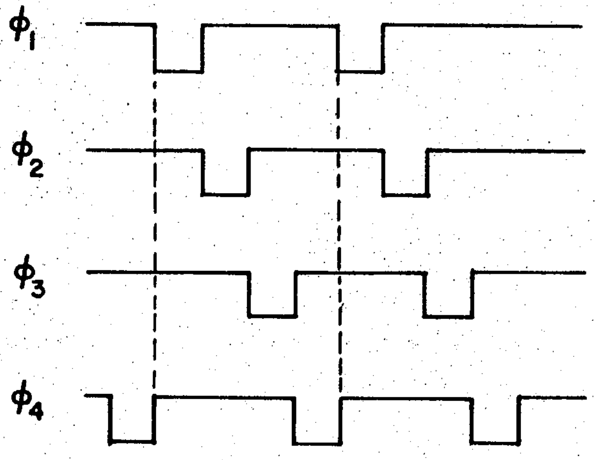
FIG. 3 is an illustration of the phase recurring clock signals which can be used in gating the FIG.-2 shift register.

The first half stage is identical to the FIG. 1 logic gate. The second half stage 27 is different from the first half stage in that the field effect transistor comprising the logical network 22 has its gate electrode 31 connected to output 5 of the first half stage 28. In addition, the field effect transistor 21 corresponding to field effect transistor 1 is gated by a third phase recurring clock signal $\Phi_3$ and field effect transistor 24 corresponding to field effect transistor 14 of half stage 28 is gated by a fourth phase recurring clock signal $\Phi_4$ instead of $\Phi_2$. The relationship between the clock signals is shown in FIG. 3. $\Phi_4$ occurs just prior to $\Phi_1$ which is followed by $\Phi_2$ and $\Phi_3$.

In operation, the output 5 of the first half stage 28 is unconditionally set true during $\Phi_1$. The inherent capacitance at 13' (see FIG. 1) is also charged during $\Phi_1$ as previously described. Transistor 14 is nonconductive during $\Phi_1$ so that no current can flow between terminals 13' and 13 for dissipating power during the time the inherent capacitance 26' is being charged. During $\Phi_2$, assuming the first input on gate electrode 11 is true, the capacitance 12 at the output 5 is permitted to discharge to electrical ground since field effect transistor 14 is turned on by the $\Phi_2$ clock signal. The output then has inverted the true input to a false output.

During $\Phi_3$, the first half stage 28 is inactive and field effect transistor 21 is turned on by the clock signal on its gate electrode 22 to set the second output unconditionally true. The inherent capacitance of the logic network connected to terminal 23' is also charged during $\Phi_3$. At the same time, field effect transistor 24 is turned off by clock signal $\Phi_4$ on its gate electrode 33 which is ground during $\Phi_3$ time as shown in FIG. 3. As a result, no electrical current can flow between terminals 23' and 23 of the logic network to dissipate excessive power. However, as indicated previously, the output 5 is false so that the signal appearing on gate electrode 31 representing the Second Input is also false. During $\Phi_4$, transistor 24 is turned on by the clock signal on its gate electrode 33 to permit the capacitance 29 at the output 25 to discharge through the logic network 22. However, since the second input is false, a relatively high input impedance path exists between the two terminals of the logic network so that the output capacitance 29 cannot discharge through the network. Therefore, the output capacitance 29 cannot discharge through the network. Therefore the outputs remains at 20-volts for indicating a logic true condition. The logic one level on the first input is therefore shifted to the output of the second half stage 27 by the clock cycle comprising $\Phi_1$ through $\Phi_4$. Other stages could be added if necessary to implement a shift register having any number of stages. The logic information appearing at one input can be gated through one stage during a delay of one bit represented by $\Phi_1$ through $\Phi_4$ clock signals.

Dotted box 34 shown between the output and terminal 23' of the logic network ($LN_2$) represents a field effect transistor gated by a clock signal which is true during $\Phi_3$ and $\Phi_4$. In certain instances, the field effect transistor 34 may be used in lieu of $T_4$. In that case, it would be necessary to apply a clock signal such as $\Phi_3$ to the bottoms terminal 23 of $LN_2$. It should also be noted that field effect transistor 34 could be connected between terminals 23' of $LN_2$ and the common connection between the output from second half stage 27 and transistor $T_3$.

I claim:

1. A logical gating circuit having an output comprising, a two-terminal logical network comprising one or more field effect transistors having one or more control electrodes, the signals on said control electrodes determining the existence of an electrical path from one terminal to the other, first phase recurring clock signal, said switch means conducting electrical current therethrough to one terminal of said logical network and to said output for simultaneously applying a voltage level to said one terminal of said logical network and to said output during a first said phase recurring clock signal, said first semiconductor switch means conducting electrical current therethrough only during said first phase recurring clock signal, second semiconductor switch means connected between the other terminal of said logical network and a different voltage level for isolating said other terminal from said different voltage level, and for connecting said second terminal to said different voltage level during a second phase recurring clock signal for enabling the output to change from said first recited voltage level to said different voltage level if an electrical path exists between the terminals of said logical network during said second phase recurring clock signal.

2. A logical gating circuit having an output comprising, a two-terminal logical network comprising one or more field effect transistors having one or more control electrodes, the signals on said control electrodes determining the existence of an electrical path from one terminal to the other, first field effect transistor means operable for simultaneously applying a voltage level to one terminal of said logical network and to said output during a first phase recurring clock signal, said first field-effect-transistor means operable only during said first phase recurring clock signal, second field-effect-transistor means connected between the other terminal of said logical network and a different voltage level for isolating said other terminal from said different voltage level during said first phase recurring clock signal whereby power dissipated by the circuit is reduced during the first phase recurring clock signal when an electrical path exists between said terminals, said second field-effect-transistor means operable during a second phase recurring clock signal for connecting said other terminal to said different voltage level whereby the output is enabled to change to said different voltage level if an electrical path exists between said terminals.

3. The circuit recited in claim 2 wherein said voltage levels each represent a logical state.

4. The circuit recited in claim 2 wherein a third field-effect-transistor means is connected between said output and said first recited terminal of said logical network, said third field-effect-transistor means being operable said first and second phase recurring clock signals and being rendered nonconductive after said second phase recurring clock signal for isolating said output from said logical network until the recurrence of said first phase recurring clock signal.

5. A multiphase gate comprising, an output, a second electrode connected to a first voltage level, and a control electrode for rendering said field effect transistor operable to conduct electrical current therethrough during a first phase recurring clock signal for connecting said first voltage level to said output, a logical network having first and second terminals and comprising one or more field effect transistors having one or more control electrodes for receiving input signals, said input signals determining the impedance of an electrical path from one terminal of said network to the other, said first terminal being connected to said output and to said one electrode of said field effect transistor.

an isolation field effect transistor having one electrode connected to said second terminal of said logical network, a second electrode connected to a second voltage level; and a control electrode for rendering said isolation field effect transistor operable only during a second phase recurring clock signal.

6. The multiphase gate recited in claim 5 wherein the second electrode and the control electrode of said first recited field effect transistor are connected together and wherein said first phase recurring clock signal applied to said common connection, said first phase recurring clock signal providing said first voltage level to said output.

7. A logical gate having an output including capacitance for storing a charge, said gate comprising, a two-terminal logical network comprising one or more field effect transistors having one or more control electrodes, the signals on said control electrodes determining the impedance of an electrical path from one terminal to the other, first field-effect-transistor means connected between a first terminal of said logical network and a voltage source, said output being connected to a common point between said first field-effect-transistor means and said first terminal, said first field effect transistor operable for applying a first voltage level to said one terminal and to said output during a first phase recurring clock signal, isolation field-effect-transistor means connected between said second terminal and a second voltage level for preventing an electrical path from occurring between said first and second voltage levels during said first phase recurring clock signal and for enabling an electrical path to exist between said output and said second voltage level through said logical network during a second phase recurring clock signal.

8. A shift register comprising, a plurality of bit storage positions, each storage position comprising, a first and second half stage, with the first half stage including a first two-terminal logical network comprising one remove field-effect-transistors having one or more control electrodes, the signals on said control electrodes determining the existence of an electrical path from one terminal to the other, an output connected to a first one of said terminals, a first field effect transistor connected between a voltage level and said first terminal, said first field effect transistor being operable during a first phase recurring clock signal for simultaneously applying a voltage level to said one terminal of said logical network and to said output, said field-effect-transistor means operable only during said first phase recurring clock signal, a second field effect transistor connected between the other terminal of said logical network and a different voltage level for isolating said other terminal from said different voltage level during said first phase recurring clock signal, for connecting said different voltage level to said second terminal during a second phase recurring clock signal, said second half stage of said shift register comprising, a second two-terminal logical network comprising one or more field effect transistors having one or more control electrodes, the signals on said control electrodes determining the existence of an electrical path from one terminal to another with at least one of said control electrodes connected to the output of said first half stage, an output connected to a first one of the terminals of said second two-terminal logical network, third field effect transistor connected between a voltage level and said first terminal of said second recited logical network, said third field effect transistor operable during a third phase recurring clock signal for simultaneously applying a first voltage level to said one terminal of the second recited logical network and to said output, a fourth field effect transistor connected between the other terminal of said second logical network and a different voltage level for isolating said other terminal from said different voltage level during said third phase recurring clock signal and for connecting said other terminal to said different voltage level during a fourth phase recurring clock signal.

* * * * *

PO-1050
(5/69)

UNITED STATES PATENT OFFICE
CERTIFICATE OF CORRECTION

Patent No. 3,617,767 Dated November 2, 1971

Inventor(s) Robert K. Booher

It is certified that error appears in the above-identified patent and that said Letters Patent are hereby corrected as shown below:

Column 5, Claim 1, line 59, delete "phase recurring clock signal, said" to --semiconductor--.

Column 5, Claim 1, line 63, delete "said", second occurrence.

Column 6, Claim 4, line 33, after "operable" and before "said" insert --during--.

Column 6, Claim 5, line 39, "an output," should be a separate paragraph.

Column 6, Claim 5, line 39, the third paragraph should begin with --a field effect transistor having one electrode connected to said output,--. (then continue with "a second electrode connected... etc.)

Column 7, Claim 8, line 21, start a new paragraph with "a first", second occurrence.

Signed and sealed this 30th day of May 1972.

(SEAL)
Attest:

EDWARD M.FLETCHER,JR.
Attesting Officer

ROBERT GOTTSCHALK
Commissioner of Patents